(12) United States Patent
Shin et al.

(10) Patent No.: US 6,708,261 B1
(45) Date of Patent: Mar. 16, 2004

(54) MULTI-STAGE DATA BUFFERS HAVING EFFICIENT DATA TRANSFER CHARACTERISTICS AND METHODS OF OPERATING SAME

(75) Inventors: Sang-woong Shin, Seoul (KR); Gyu-hong Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/377,428

(22) Filed: Aug. 19, 1999

(30) Foreign Application Priority Data

Aug. 20, 1998 (KR) .............................. 98-33796

(51) Int. Cl.⁷ .............................................. G06F 12/06
(52) U.S. Cl. .......................... 711/167; 326/83; 710/1
(58) Field of Search ................... 711/169, 167; 710/1; 365/189.05, 233; 326/83

(56) References Cited

U.S. PATENT DOCUMENTS

| | | | |
|---|---|---|---|
| 5,815,462 A | * 9/1998 | Konishi et al. | 365/189.05 |
| 5,867,446 A | * 2/1999 | Konishi et al. | 365/233 |
| 5,990,715 A | * 11/1999 | Nishimura | 327/158 |
| 6,023,181 A | * 2/2000 | Penny et al. | 327/291 |
| 6,025,738 A | * 2/2000 | Masleid | 326/83 |
| 6,101,197 A | * 8/2000 | Keeth et al. | 370/503 |
| 6,172,524 B1 | * 1/2001 | Cho | 326/70 |
| 6,304,937 B1 | * 10/2001 | Farmwald et al. | 710/310 |
| 2001/0043099 A1 | * 11/2001 | Kawasaki et al. | 327/291 |

FOREIGN PATENT DOCUMENTS

| | | |
|---|---|---|
| JP | 9-153279 | 6/1997 |
| KR | 97-60219 | 8/1997 |

OTHER PUBLICATIONS

Notice to Submit Response, Korean Application No. 10–1998–0033796, Jul. 31, 2000.

* cited by examiner

*Primary Examiner*—Pierre-Michel Bataille
(74) *Attorney, Agent, or Firm*—Myers Bigel Sibley & Sajovec

(57) ABSTRACT

Integrated circuit devices having signal buffers therein include first and second storage devices that are electrically coupled in series and configured so that data can be loaded into the first storage device in-sync with a first clock signal (e.g., external clock signal) and then passed and loaded into the second storage device in-sync with a second clock signal (e.g., internal clock signal). The second clock signal is derived from the first clock signal and may be a delayed version of the first clock signal having an equivalent duty cycle. The buffer also comprises an integrated circuit that operates synchronously with the second clock signal and a transfer device that passes an output of the second storage device to the integrated circuit in-sync with the second clock signal. In this manner, data can be loaded into the integrated circuit in-sync with the same clock signal used to control the integrated circuit even though the data is originally transferred in-sync with another clock signal.

6 Claims, 2 Drawing Sheets

MULTI-STAGE DATA BUFFERS HAVING EFFICIENT DATA TRANSFER CHARACTERISTICS AND METHODS OF OPERATING SAME

RELATED APPLICATION

This application is related to Korean Application No. 98-33796, filed Aug. 20, 1998, the disclosure of which is hereby incorporated herein by reference.

FIELD OF THE INVENTION

The present invention relates to integrated circuit devices, and more particularly to integrated circuit devices having signal buffers therein.

BACKGROUND OF THE INVENTION

Signal buffers have been used frequently as input buffers on integrated circuit chips so that the excessive voltage levels of some external signals can be level-shifted downward to levels that are appropriate for those circuits that reside on the chip. For example, control signals buffers on CMOS-based chips may be used to level-shift external signals at higher TTL levels to lower CMOS levels. This level-shifting operation is typically performed on control signals such as an external clock signal ECLK that is being converted to an internal clock signal PCLK. However, because the level-shifting operation may result in some degree of delay to the internal clock signals and because internal circuits on a chip may need to operate in-sync with the internal clock signal, it may become necessary to delay external data signals on-chip so that sufficient set-up and hold time margins are maintained when processing data in-sync with the internal clock signal. As will be understood by those skilled in the art, such delays may be provided by data buffers having RC delay circuits therein. Unfortunately, RC delay circuits tend to reduce the slope of data signal transitions, consume relatively significant amounts of power and have relatively large unit cell size (i.e., occupy relatively large amounts of chip area). Thus, notwithstanding such attempts to use RC delay circuits to facilitate synchronization between data and internal clock signals, there continues to be a need for devices and methods that provide improved data synchronization capability.

SUMMARY OF THE INVENTION

It is therefore an object of the present invention to provide data buffers that can provide sufficient time margins to enable efficient and accurate transfer of synchronous data and methods of buffering data to provide sufficient time margins.

These and other objects, advantages and features of the present invention are provided by a preferred multi-stage data buffer. The data buffer comprises first and second storage devices that are electrically coupled in series and configured so that data can be loaded into the first storage device in-sync with a first clock signal (e.g., external clock signal) and then passed and loaded into the second storage device in-sync with a second clock signal (e.g., internal clock signal). According to a preferred aspect of the present invention, the second clock signal is derived from the first clock signal and may be a delayed version of the first clock signal having an equivalent duty cycle. The buffer also comprises an integrated circuit that operates synchronously with the second clock signal and a transfer device that passes an output of the second storage device to the integrated circuit in-sync with the second clock signal. In this manner, data can be loaded into the integrated circuit in-sync with the same clock signal used to control the integrated circuit even though the data is originally transferred in-sync with another clock signal. A level-shifting inverter may also be provided having an output electrically coupled to an input of the first storage device.

In a most preferred embodiment of the present invention, the data is loaded into the second storage device in-sync with a first edge of the second clock signal and the transfer device passes the output of the second storage device to the integrated circuit in-sync with a second edge of the second clock signal. Here, the first and second edges of the second clock signal may be falling and rising edges, respectively. Moreover, the first storage device comprises a first transmission gate (e.g., CMOS transmission gate) and a first latch having an input electrically coupled to an output of the first transmission gate. Similarly, the second storage device may comprise a second transmission gate having an input electrically coupled to an output of the first latch and a second latch having an input electrically coupled to an output of the second transmission gate.

A preferred method of buffering data is also provided. This preferred method includes the steps of loading a data signal into a first storage device in-sync with a first clock signal and then passing the data signal from the first storage device into a second storage device, in-sync with a first edge of a second clock signal that is derived from the first clock signal. A step is then performed to pass the data signal from the second storage device to an integrated circuit, in-sync with a second edge of the second clock signal. Based on these aspects of the present invention, data buffers can be provided that secure a sufficient time margin (e.g., set-up time, hold time) to enable efficient and accurate transfer of synchronous data.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. Like numbers refer to like elements throughout and signal lines and signals thereon may be referred to by the same reference symbols.

Figure 1:
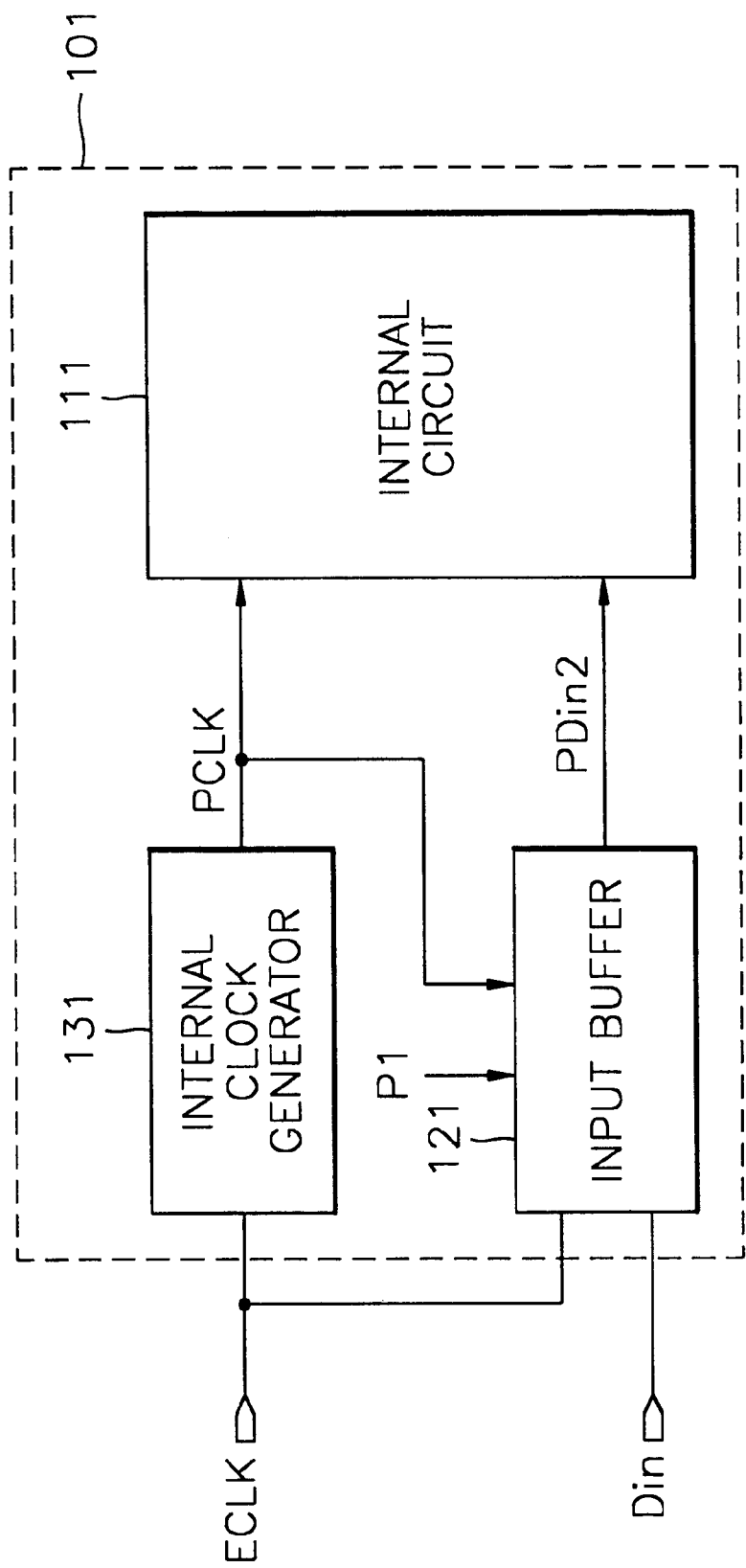
FIG. 1 is a block diagram of an integrated circuit device according to an embodiment of the present invention.

Referring now to FIG. 1, a preferred integrated circuit device 101 (e.g., memory device) according to an embodiment of the present invention will be described. As illustrated, the integrated circuit-device 101 includes an internal clock generator 131, an input buffer 121 and an internal integrated circuit 111 which may, for example, include a memory array. The internal clock generator 131 may perform the function of converting an external clock signal ECLK into an internal clock signal PCLK. A level shifting function may also be performed by the internal clock generator 131 so that the voltage level of the internal clock signal PCLK is consistent with the requirements of the internal integrated circuit 111 which has its timing controlled by the internal clock signal PCLK. As illustrated by the timing diagram of FIG. 3, the internal clock signal PCLK may be a delayed version of the external clock signal ECLK, with the delay equal to "td", as illustrated. Although not necessary, the internal clock signal PLCK may also have the same duty cycle as the external clock signal ECLK. The input buffer 121 performs the function of buffering input data Din and passing the buffered input data Pdin2 to the internal integrated circuit 111 in-sync with the internal clock signal PCLK.

Figure 2:
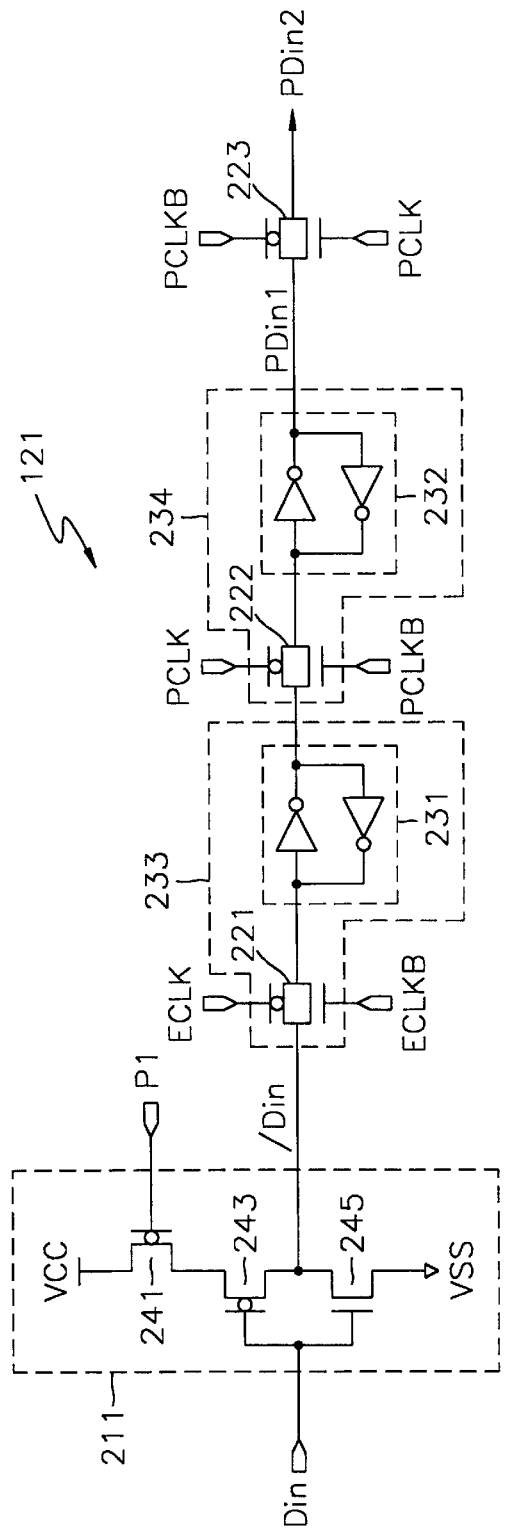
FIG. 2 is an electrical schematic of a preferred input buffer, according to the embodiment of FIG. 1.
Figure 3:
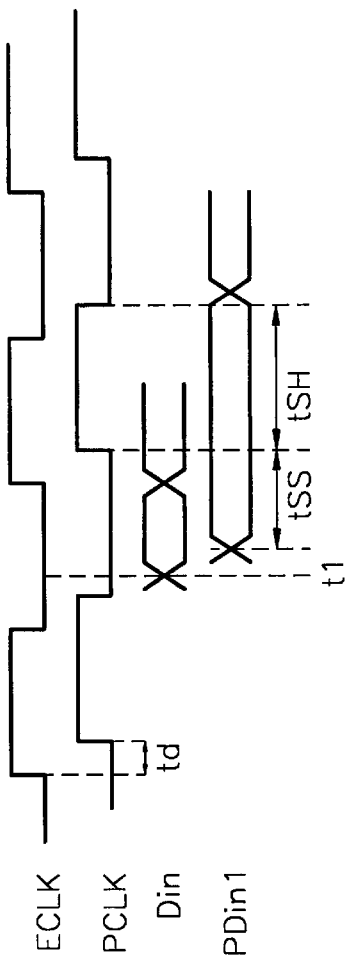
FIG. 3 is a timing diagram that illustrates operation of the input buffer of FIG. 2.

Referring now to FIGS. 2–3, a preferred input buffer 121 is illustrated. This input buffer 121 includes a voltage converter 211, a first storage device 233, a second storage device 234 and a transfer device 223. In particular, the illustrated voltage converter 211 performs a voltage level shifting operation so that an output thereof/Din does not exceed a predetermined level (e.g., 3.3 volts). The voltage converter 211 also inverts the binary value of the input signal Din since the combination of the NMOS pull-down transistor-245 and PMOS pull-up transistor 243 operate as a conventional inverter. A control signal P1 is also provided to a gate electrode of a second PMOS pull-up transistor 241. Based on this configuration of the voltage converter 211, the application of a logic 1 signal to the control signal line P1 will operate to turn off the second PMOS pull-up transistor 241 and prevent input data Din from being passed to the output/Din.

The first storage device 233 comprises a first CMOS transmission gate 221 and a first latch 231. The first transmission gate 221 is responsive to the external clock signal ECLK and an inverted version of the external clock signal ECLKB. The first latch 231 comprises a pair of inverters electrically connected in antiparallel. Based on this configuration of the first storage device 233, a data signal/Din at the output of the voltage converter 211 can be passed to the first latch 231 when the first transmission gate 221 receives a falling edge of the external clock signal ECLK. The second storage device 234 comprises a second CMOS transmission gate 222 and a second latch 232. The second transmission gate 222 is responsive to the internal clock signal PCLK and an inverted version of the internal clock signal PCLKB. The second latch 232 comprises a pair of inverters electrically connected in antiparallel. Based on this configuration of the second storage device 234, the output of the first latch 231 can be passed to the second latch 232 when the second transmission gate 222 receives a falling edge of the internal clock signal PCLK. As illustrated by FIG. 3, this falling edge of the internal clock signal PCLK is delayed relative to the falling edge of the external clock signal ECLK by a delay equal to "td". Finally, the output PDinl of the second latch 232 can be passed to the output PDin2 of the transfer device 223 (e.g., third CMOS transmission gate) when the transfer device 223 receives a rising edge of the internal clock signal PCLK.

Accordingly, a falling edge of the external clock signal ECLK will enable input data Din received by the input buffer 121 to be latched by the first latch 231, with the output of the first latch 231 having the same binary value as the input data Din. In particular, because the voltage converter 211 has a relatively short delay associated therewith, updated input data Din received by the voltage converter 211 while the external clock signal ECLK is at a logic 0 level will become latched by the first latch 231. However, once the external clock signal ECLK undergoes a rising edge transition, further changes to the input data Din while ECLK is held at a logic 1 level will not influence the output of the first latch 231. In addition, because the amount of time required for the data signal Din to pass through the voltage converter 211 and the first and second latches 231 and 232 is equal to the time interval "t1" and because the second transmission gate 222 is opened in response to a falling edge of the internal clock signal PCLK, the time interval "tSS" determines the available set-up time for the data Din to become latched by the second latch 232. Then, in response to the next rising edge of the internal clock signal PCLK, the latched data is passed through the transfer device 223 to the output PDin2 of the input buffer 121. This data remains valid for a time interval equal to "tSH". This time interval corresponds to a relatively long duration hold time that is equal to the duration of each logic 1 pulse generated by the internal clock generator 131. Moreover, the chip area and power consumed by the input buffer 121 is typically considerably less than the chip area and power required by conventional RC delay circuits.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit device, comprising:
   an internal clock generator that is configured to generate an internal clock signal in-sync with an external clock signal received by the integrated circuit device;
   a multi-stage data buffer that is configured to receive the external and internal clock signals and non-clock data generated external to the integrated circuit device, said multi-stage data buffer comprising first and second storage devices that are electrically connected together in series and configured so that the data is loaded into the first storage device in-sync with the external clock signal, which is received by the first storage device, and then passed and loaded into the second storage device in-sync with the internal clock signal, which is received by the second storage device; and
   a level-shifting inverter that is configured to pass the data generated external to the integrated circuit device to an input of the first storage device, and is responsive to a control signal that enables a pull-up path of the level-shifting inverter when active.

2. The device of claim 1, wherein the data is loaded into the first storage device in response to a falling edge of the external clock signal and then passed and loaded into the second storage device in response to a falling edge of the internal clock signal.

3. The device of claim 2, further comprising:
   a transfer device that is configured to pass an output of the second storage device to an input data signal line in response to a rising edge of the internal clock signal.

4. The device of claim 1, wherein the level-shifting inverter comprises a PMOS pull-up transistor having a gate terminal that is responsive to the control signal.

5. The device of claim 4, wherein in response to an inactive control signal, the level-shifting inverter is configured to periodically have a high-impedance output upon receipt of the data.

6. The device of claim 4, further comprising:
   a transfer device that is configured to pass an output of the second storage device to an input data signal line in response to a rising edge of the internal clock signal.

* * * * *